United States Patent
Chapman et al.

(10) Patent No.: US 9,219,505 B2
(45) Date of Patent: Dec. 22, 2015

(54) AAS TRANSMITTER DISTORTION IMPROVEMENT

(71) Applicant: Telefonaktiebolaget L M Ericsson (publ), Stockholm (SE)

(72) Inventors: Thomas Chapman, Stockholm (SE); Torbjorn Elfstrom, Fjaras (SE); Farshid Ghasemzadeh, Sollentuna (SE); Leonard Rexberg, Hasselby (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 112 days.

(21) Appl. No.: 14/043,422

(22) Filed: Oct. 1, 2013

(65) Prior Publication Data

US 2014/0106691 A1    Apr. 17, 2014

Related U.S. Application Data

(60) Provisional application No. 61/708,312, filed on Oct. 1, 2012.

(51) Int. Cl.
*H04B 1/04* (2006.01)
*H03F 3/24* (2006.01)

(52) U.S. Cl.
CPC .............. *H04B 1/0475* (2013.01); *H03F 3/24* (2013.01); *H03F 2200/66* (2013.01)

(58) Field of Classification Search
CPC .......... H04B 1/0475; H04B 1/04; H03F 3/24; H03F 2200/66; H04L 5/06; H04L 27/2614; H04L 5/02; H04L 27/26; H04K 1/02

USPC .............. 455/114.3, 63.1, 67.13, 67.7, 114.2; 375/297

See application file for complete search history.

(56) References Cited

U.S. PATENT DOCUMENTS

| | | | | |
|---|---|---|---|---|
| 5,638,403 | A * | 6/1997 | Birchler et al. | 375/296 |
| 5,783,969 | A * | 7/1998 | Luz | 330/124 R |
| 5,933,766 | A * | 8/1999 | Dent | 455/103 |
| 6,128,351 | A * | 10/2000 | Jones et al. | 375/284 |
| 7,020,215 | B2 * | 3/2006 | Porco et al. | 375/297 |
| 7,539,269 | B2 * | 5/2009 | Vadde et al. | 375/297 |
| 8,259,846 | B2 * | 9/2012 | Liang et al. | 375/296 |
| 2003/0179833 | A1 | 9/2003 | Porco et al. | |
| 2006/0067426 | A1 | 3/2006 | Maltsev et al. | |
| 2007/0183371 | A1 | 8/2007 | McCoy et al. | |
| 2009/0060070 | A1 | 3/2009 | Hayase et al. | |

FOREIGN PATENT DOCUMENTS

EP        2439866 A1     4/2012

OTHER PUBLICATIONS

International Search Report and Written Opinion issued in corresponding PCT Application No. PCT/EP2013/070478 on Feb. 11, 2014, 10 pages.

* cited by examiner

*Primary Examiner* — Pablo Tran
(74) *Attorney, Agent, or Firm* — Rothwell, Figg, Ernst & Manbeck, P.C.

(57) ABSTRACT

The invention provides a method for processing signals in a radio transmission apparatus (60) and a radio transmission apparatus (60) comprising a plurality of radio transmitters (61, 62), wherein clipping is applied to a signal in at least one of the plurality of radio transmitters, wherein the amount of clipping or/and a clipping threshold is adjusted individually for each of the plurality of radio transmitters.

19 Claims, 7 Drawing Sheets

AAS TRANSMITTER DISTORTION IMPROVEMENT

This application claims priority to provisional application Ser. No. 61/708,312, filed on Oct. 1, 2012, the entire contents of which axe incorporated herein by reference.

TECHNICAL FIELD

The present invention relates to a radio transmission system comprising a plurality of radio transmitters which are adapted to apply clipping to an input signal to be transmitted, and to a method for processing signals in such a radio transmission system.

BACKGROUND

Traditionally, antenna arrays at base-stations were constructed by means of passive fixed beam antennas each driven from a single radio transmission/reception unit. However in recent years, technological advances mean that advanced base stations can be equipped with an array of antennas where individual antennas or subgroups of antennas are each driven with their own radio transmission/reception unit. Such arrangements are referred to as "Active Antenna Systems", or AAS.

A functional overview of an AAS base station is provided in FIG. 1. The base station comprises a number of transceiver units TXU/RXU 1, TXU/RXU 2, ..., TXU/RXU K, in FIG. 1 depicted as transceiver array 11. Each transceiver unit is mapped onto one or more physical antennas A11 ... Amn by means of a radio signal distribution network (RDN) 12.

AAS offers flexibility to optimize radio network performance by means of a variety of potential applications. These include but are not limited to variable electronic downtilt, cell splitting, user specific beamforming and spatial multiplexing. Applications may each involve "beamforming". Beamforming, also denoted spatial filtering, is a signal processing technique used in sensor and/or transmitter arrays for directional signal reception or transmission. This is for example achieved by combining elements in a phased array in such a way that signals at particular angles experience constructive interference while others experience destructive interference, thereby achieving spatial selectivity. The improvement compared with omnidirectional reception/transmission is known as the receive/transmit gain (or loss). Beamforming is achieved by individually modifying the phase and the amplitude of the signal that is transmitted from each of the different transceivers.

In any cellular system, an important parameter relating to the transmitter system is the quality of the transmitted signal. If the quality of the transmitted signal is imperfect, then in addition to the wanted in band signal a certain amount of distortion in band components will be transmitted. At the receiver, the relative RX power levels of the wanted signal and the distortion components will not vary according to the wanted signal RX power level. Thus, when the Signal to Interference and Noise level (SINR) at the receiver is large, then the distortion components may become a limiting factor in demodulation performance.

Transmitter induced distortion can arise from many sources such as phase error, PA (Power Amplifier) non linearity, transmitter noise etc. A very significant source of distortion is due to so-called clipping, in which the peak power of the transmitter signal is limited in order to limit the peak to average power ratio at the power amplifier. Avoiding a large peak to average power ratio is essential for achieving an economic power amplifier design with low distortion. However limiting the transmitted signal in this way causes transmitter induced distortion.

Transmitter induced distortion due to peak power reduction schemes can show a large spatial fluctuation in AAS (Active Antenna System), which will significantly reduce performance in some areas of the cell and can cause significantly increased implementation costs.

An AAS system must also meet a requirement on the quality of the transmitted signal. The requirement must be met at each point in space at which a scheduled UE receives the signal from the base station.

One existing solution is to set a requirement on the maximum EVM (Error Vector Magnitude) at the antenna connector. AAS systems consist of possibly multiple antenna connectors. A first problem with the existing solution is that antenna connectors may not be available in an AAS system. However assuming that the AAS can be controlled at the antenna connector and meet a requirement, there exists a further problem due to beamforming. The beamforming involves modifying the phase and the amplitude of the signal transmitted through each radio transmitter.

Clipping, as mentioned above and further described below must be applied at each radio transmitter of the AAS. The clipping noise is in phase with the signal, and thus the phase element of the beamforming will apply to the clipping noise in addition to the transmitted signal.

However the relative level of clipping compared to the wanted signal will depend on the amplitude of the signal. Thus when amplitude weighting is applied to the signal that is different at each transmitter, the power of the clipping signal relative to the wanted signal will differ at each of the transmitters given uniform clipping thresholds. This will have the effect of causing the spatial characteristics of the radiated clipping signal to differ to those of the wanted signal.

A UE that is within the main beam of the wanted signal may experience a reduced distortion level from the clipping, and hence experience a lower EVM than required. However a UE that is within a side lobe or null of the wanted signal that does not correspond to a side lobe or null of the clipping signal may experience very poor EVM.

A possible but inferior solution to this problem is to tighten the EVM requirement at each transmitter antenna connector such that even at the point in space at which the received EVM is at its worst, the existing requirement is met. This would however imply a very tight requirement on each transmitter, which may be difficult or impossible to meet and/or imply very high cost.

SUMMARY

It is thus a goal of the present invention to provide methods and devices to mitigate the above-mentioned effects of clipping, particularly considering beamforming, in an AAS. Herein, the term clipping refers to peak power reduction schemes deliberately restricting the peak power of a signal.

According to the invention, there is provided a method for processing signals in a radio transmission apparatus comprising a plurality of radio transmitters, wherein clipping is applied to a signal in at least one of the plurality of radio transmitters, wherein the amount of clipping or/and a clipping threshold is adjusted individually for each of the plurality of radio transmitters.

Further, there is provided a radio transmission apparatus, comprising a plurality of radio transmitters which are adapted to apply clipping to an input signal to be transmitted, wherein the amount of clipping or/and a clipping threshold is adjusted individually for each of the plurality of radio transmitters.

Further, there is provided a computer program, comprising instructions which, when executed or interpreted by at least one processor, cause the at least one processor to carry out the above method, a computer program product, comprising said computer program and a carrier containing said computer program or said computer program product. Said carrier may be any tangible or non-tangible suitable carrier, and may specifically be or comprise one of an electrical signal, optical signal, radio signal, acoustic signal, magnetic tape or disk, optical disk, semiconductor memory, or paper.

BRIEF DESCRIPTION OF THE DRAWINGS

Further characteristics and advantages of the invention will become better apparent from the detailed description of particular but not exclusive embodiments, illustrated by way of non-limiting examples in the accompanying drawings, wherein.

DETAILED DESCRIPTION

Figure 1:
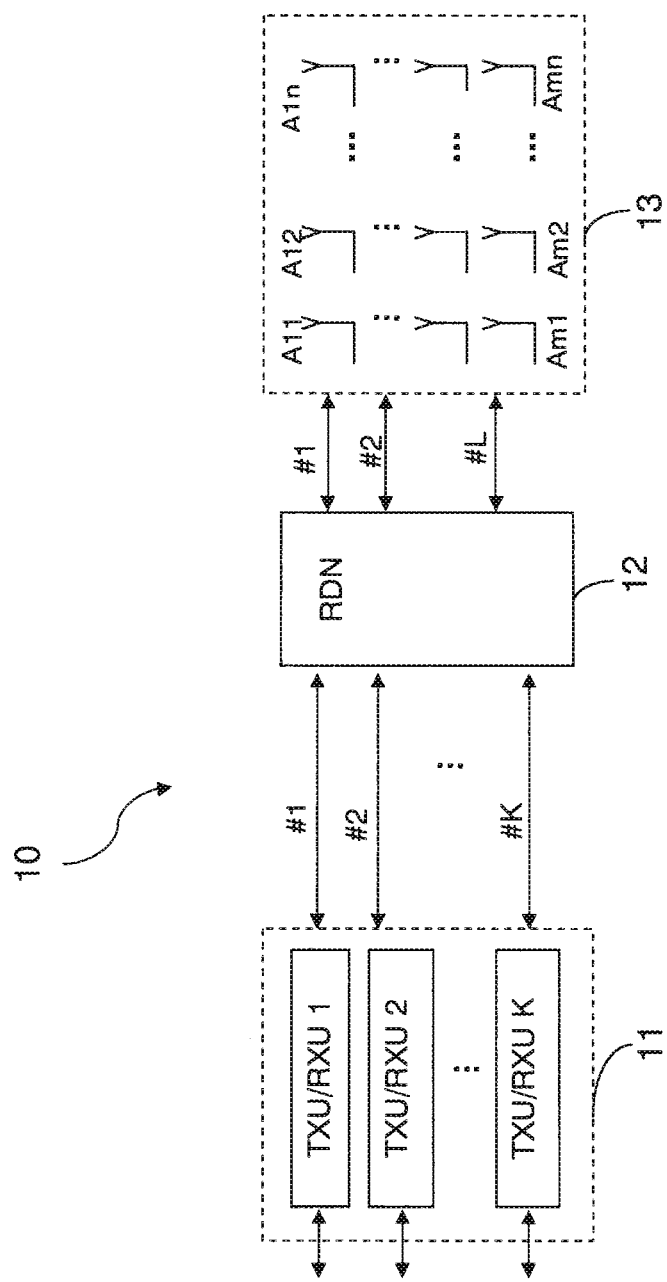
FIG. 1 shows the generic architecture of an Active Antenna System (AAS)

Embodiments of the invention will be described in more detail below; in this description and/or the figures, the following abbreviations may be used:
AAS Active Antenna System
EVM Error Vector Magnitude
PA Power Amplifier
RDN Radio (signal) Distribution Network
RF Radio Frequency
RX Receive
UE User Equipment
The above method and devices according to the invention are based on the following considerations:

The amount of clipping applied at a transmitter can be increased above the level strictly required for acceptable PA operation. According to the invention, the clipping and possibly clipping threshold applied at each transmitter is adjusted.

This adjustment can for example be made such that the ratio of clipping to wanted signal is the same at each transmitter. In this case, the spatial pattern of the clipping noise will be the same as that of the wanted signal, and thus areas of very poor EVM would not appear.

It is also conceivable to adjust the level of clipping on some transmitters such that although the spatial pattern of the clipping signal is not the same as the wanted signal, the level of clipping noise is reduced at the location of the scheduled UE The additional clipping may be performed immediately prior to the PA in the RF subsystem. Alternatively, a clipping stage could be included in the baseband in addition to the clipping in the RF subsystem, whose purpose is to apply additional clipping to adjust the clipping noise spatial pattern.

A further alternative is to adjust both the weight tapering and the amount of clipping in each of an array of transmitters in an AAS system such that the signal presented to each PA meets peak to average requirements whilst the clipping noise received by the UE relative to the wanted signal is at an acceptable level. The term tapering refers to the array antenna excitation in terms of amplitude distribution over the antenna aperture. Thereby, the SINR (Signal to Interference, and Noise Radio) for the scheduled UE can be maximised. Adjusting the clipping and the tapering will have the impact of modifying both the wanted signal and the clipping distortion spatial patterns.

One general idea of the invention is thus to adjust the amount of clipping and/or weight tapering performed in each of an array of transmitters in an AAS system, such that the signal presented to each PA meets peak to average requirements whilst the clipping noise received by the UE relative to the wanted signal is at an acceptable level.

The invention thus provides a method for processing signals in a radio transmission unit comprising a plurality of radio transmitters, wherein clipping is applied to a signal in at least one radio transmitter wherein the clipping is applied such that the ratio of a noise signal generated by clipping to a wanted signal at a predefined or dynamic location of a receiver is kept below a predefined or dynamically adjusted threshold.

This method can particularly be applied in an active antenna system, and more particularly in which beamforming is applied by according control of the plurality of radio transmitters.

By the method it is ensured that at the location of a receiver, which may for example be a user equipment, the effect of clipping noise is kept at a tolerable level.

It may be provided that clipping is applied to two or more, or even all, of the plurality of radio transmitters.

In one embodiment, clipping is applied such that the ratio of the clipping noise signal to wanted signal is the same for all of the plurality of radio transmitters. By this, the spatial pattern of the clipping noise signal is the same as the spatial pattern of the wanted signal, and accordingly the SNR is the same at each location, i.e. for any receiver regardless of its position.

In an alternative embodiment, clipping is adjusted specific to each radio transmitter such that the level of clipping noise, and particularly the ratio of the clipping noise signal to wanted signal, is below a threshold at a defined location. The threshold can be predetermined or dynamically set. Alternatively, the clipping may be adjusted such that SINR is maximised and/or EVM is minimised at a defined location.

The defined location can e.g. be the location of a receiver like a user equipment; it is also conceivable that more than one location, depending e.g. on the number of receivers in a certain region like a radio cell or sector, is taken into account. Thereby, the SNR can be set to a tolerable level at least at relevant locations, i.e. locations of the receivers.

Particularly, the clipping may be adjusted such that a spatial distribution of a noise signal generated by clipping is substantially identical to a spatial distribution of a wanted signal. I.e., the main and side lobes of the noise signal created by clipping are substantially identical to the main and side lobes of the wanted signal. Thereby, the signal-to-noise ratio or EVM is the same or at least comparable at any location within the reception area.

As an alternative, the clipping may be adjusted such that the direction of a main lobe of a noise signal generated by clipping is different from the direction of a main lobe of a wanted signal. I.e., main power of the noise signal is radiated in a direction different from the main power of the wanted signal, for example in the direction of an area of lower signal strength (direction between lobes) of the wanted signal. Thereby, the signal to noise ratio or EVM of the wanted signal in the main lobe—or generally in a desired direction—can be improved, however likely at the cost of a decreased signal to noise ratio in other directions.

The invention further provides a radio transmission system, comprising a plurality of radio transmitters which are adapted to apply clipping to an input signal to be transmitted, wherein the clipping is applied specific to each radio transmitter such that the ratio of a noise signal generated by clipping to a wanted signal at a predefined or dynamic location of a receiver is kept below a predefined or dynamically adjusted threshold.

The radio transmission system may further comprise a plurality of power amplifiers connected to or being comprised in the radio transmitters and adapted to amplify the input signal, which may be clipped as mentioned above, before transmission.

The radio transmission system may further comprise a plurality of antennas connected to the radio transmitters and/or the power amplifiers.

Particularly, the radio transmission system may be adapted to perform the method as described above. Thus, the radio transmission system may also comprise a processor adapted to determine the respective amount of clipping to be applied at each radio transmitter.

The principle advantage of the invention is that it avoids points in space at which distortion components of the transmitted signal are received with high gain whilst the wanted signal is experienced at low gain. This in turn avoids the need to set very stringent requirements on EVM at each of the transmitters in order to provide sufficient EVM at the worst point in space, which will prevent a significant increase in the cost, size and power consumption of the radio transmitters.

In the following, embodiments of the invention are explained with reference to the figures.

FIG. 1 shows a generic architecture of an Active Antenna System (AAS) 10 and thus provides a functional overview of an AAS base station, which may comprise such an AAS. This AAS 10 comprises a number of transceiver units TXU/RXU 1, TXU/RXU 2, ..., TXU/RXU K, i.e. radio transmitters, in the example of FIG. 1 arranged as transceiver array 11. Each transceiver unit is mapped onto one or more physical antennas A11 ... Amn, e.g. elements of an antenna array 13, by means of a radio signal distribution network (RDN) 12. Therefore, a number of K connections, matching the number of transceiver units, are arranged between the transceiver array 11 and the radio signal distribution network 12. Radio signal distribution network (RDN) 12 is connected to antenna array 13 by a number of L connectors, which may for example match the total number of antenna elements A11 ... Amn comprised in antenna array 13. Of course also an embodiment without a RDN is conceivable wherein each of a plurality of transceivers is directly connected to one or more antennas, or is even integrated with an antenna module comprising one or more antenna elements. Thus, in some implementations, actual connectors might not exist.

Active Antenna System (AAS) base stations may be implemented in a variety of different ways. The radio transmission/reception units may be located in immediate proximity to the antenna elements, or they may be located elsewhere. The processing that is responsible for the beamforming may similarly be integrated with the radio frequency electronics or elsewhere. Furthermore, baseband processing may be located within the antenna module or elsewhere.

AAS base stations may take a variety of different form factors, and there exist a variety of different AAS configurations. Parameters that might vary include the number of antenna elements in the vertical and horizontal directions, the spacing between the antennas, the number of antennas driven from each transmission/reception unit, the transmission power of the base station etc.

In 3GPP systems, the quality of the transmitted signal is measured via "Error Vector Magnitude" (EVM), which refers to the ratio of the distortion components to the signal power. In the existing specifications, requirements are set on the maximum allowable EVM at the antenna connector of the base station. Note that the EVM can thus be translated into a signal to noise/interference ratio where an increase in the distortion component would degrade the signal to noise/interference and consequently have negative impact on bit-rate. In non AAS systems, the EVM at each point in space will be the same as the EVM measured at the antenna connector, since both the wanted and the distortion components of the transmitted signal undergo the same antenna gain and path-loss.

The transmitted distortion signal is made up of a number of components. A significant component though is a result of "clipping" of the wanted signal. "Clipping" refers to peak power reduction schemes deliberately restricting the peak power of the signal and is often required in order to avoid non linearity in the power amplifier due to significant fluctuations of power.

Figure 2:
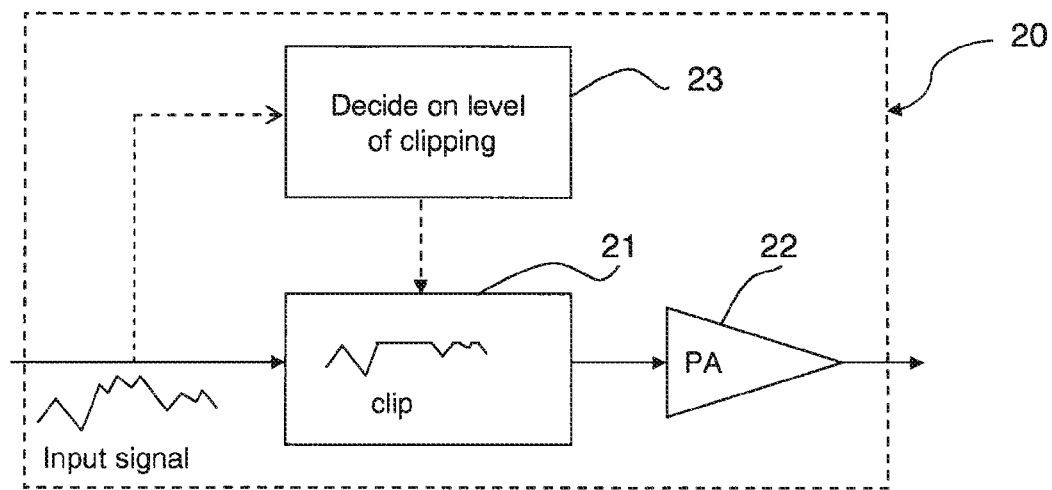
FIG. 2 shows a generic transceiver.

FIG. 2 illustrates a generic radio transceiver 20, particularly the transmitter part thereof, including a clipping function. Radio transceiver 20 comprises a clipping block 21 which applies clipping in the above-mentioned way to an input signal, a power amplifier 22 adapted to amplify the clipped input signal received from clipping block 21 and a processor 23 determining the amount of clipping applied by clipping block 21. Many components of a transceiver, including filters, digital to analogue converters etc. have been omitted from the diagram for clarity. Also, one or more antennas to which the output signal of power amplifier 22 may be passed are not depicted in FIG. 2.

Based on the input signal and the characteristics of the power amplifier 22, the transceiver decides on how much clipping should be applied. This decision can e.g. be made by processor 23 comprised in the transceiver, or by other means generally known to the skilled person. The clipping is then implemented onto the input signal, before it is applied to the power amplifier 22. The amount of clipping that is required may depend on the power level of the signal, the power amplifier (PA) maximum power and the peak to average ratio of the signal.

Figure 3:
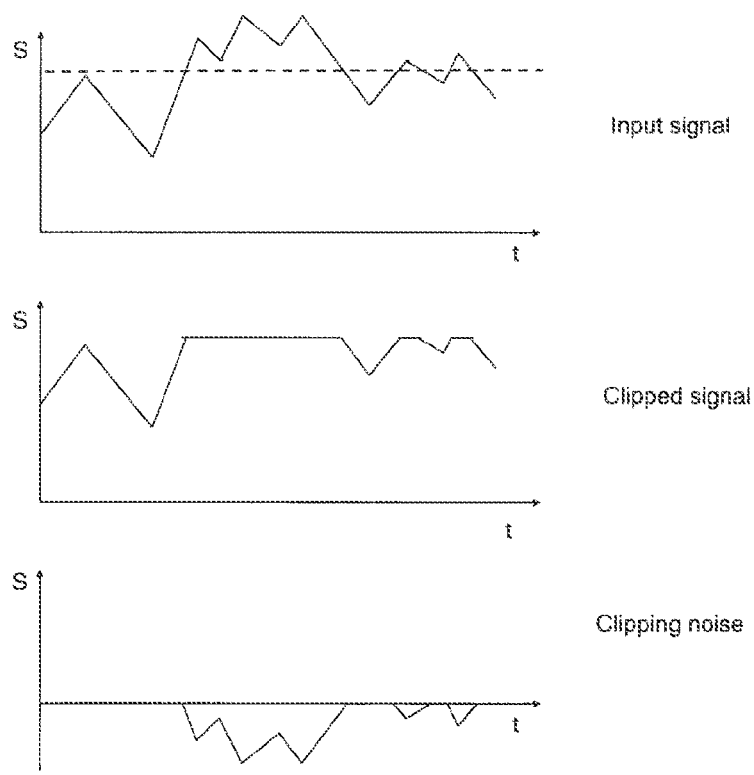
FIG. 3 depicts the relationship between input signal, clipped signal and noise signal.

"Clipping" can be thought of as a distortion signal, as illustrated in FIG. 3. Shown here is, in the top diagram, an input signal which, at certain times, exceeds a threshold S and is at these times restricted, i.e. clipped to this threshold value S, resulting in the clipped signal shown in the middle diagram. The difference between the clipped signal and the input signal, shown in the bottom diagram, may be considered as a distortion signal or clipping noise.

In an AAS system each antenna or subgroup of antennas is driven by a separate radio unit, i.e. in the examples provided herein by a separate transceiver as depicted in FIGS. 1 and 2. In addition, a gain and phase weighting is applied separately at each radio unit. Due to the different gain weightings, the amount of peak power reduction that needs to be applied at each radio unit differs. This in turn implies that the magnitude of the transmitter induced distortion differs at each antenna. Differing magnitudes of distortion relative to the wanted signal at the antennas implies that the spatial pattern of the transmitter induced distortion differs from the spatial pattern of the wanted signal. A different pattern of transmitter induced distortion leads to areas in space in which the distortion level is larger than the wanted signal level, which can cause radio performance to be poor and data rates to be limited.

Figure 4:
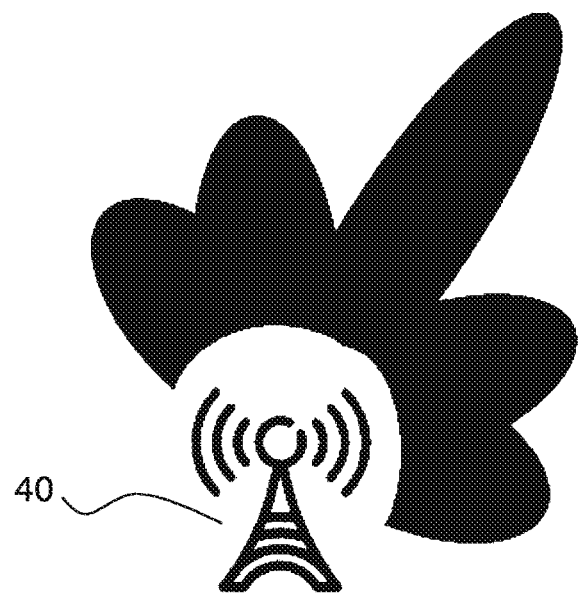
FIG. 4 shows an AAS base station transmitting a beamformed signal.

FIG. 4 shows an AAS base station 40 transmitting a beamformed signal without any distortion or noise components, or with such components having the same spatial characteristics as the wanted signal. The transmitted beamformed signal has one central main lobe and several side lobes, illustrating the signal strength at certain locations. It can be seen that between the lobes, areas of lower signal strength occur.

Figure 5:
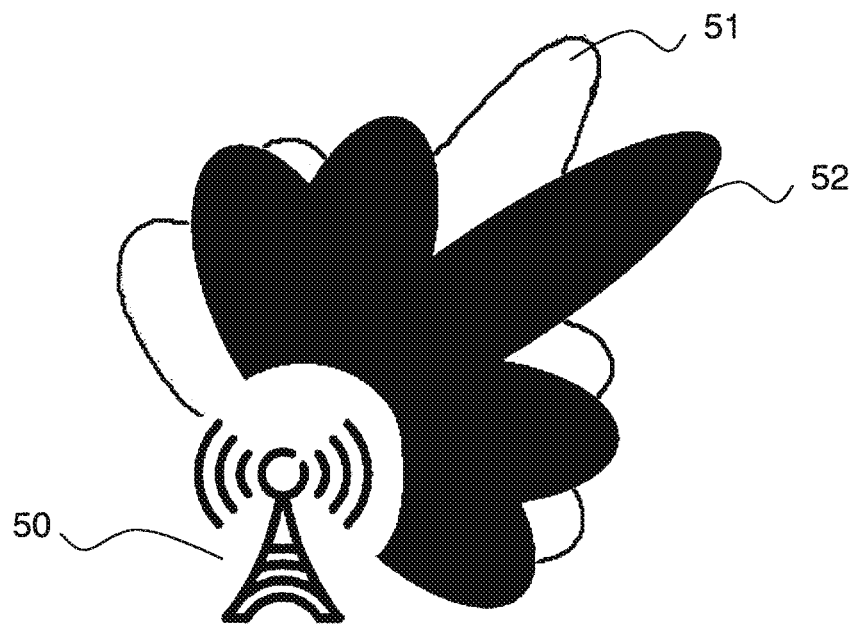
FIG. 5 shows an AAS base station in an example transmitting a beamformed wanted signal and noise signal.

FIG. 5 shows an AAS base station 50, similar to AAS base station 40 of FIG. 4, transmitting a beamformed signal and a distortion or noise signal which does not have the same spatial characteristics as the wanted signal. FIG. 5 shows the spatial characteristics, i.e. the main and side lobes, of the wanted signal, similar to FIG. 4, in bordered white color, denoted with reference numeral 51, and the spatial characteristics, i.e. the main and side lobes, of the distortion or noise signal, in filled black color, denoted with reference numeral 52. It is apparent that in this example the main lobe of the distortion or noise signal falls in an area of low signal strength (resp. a Null) of the wanted signal, thus creating a low SNR resp. a very poor EVM in that area.

Figure 8:
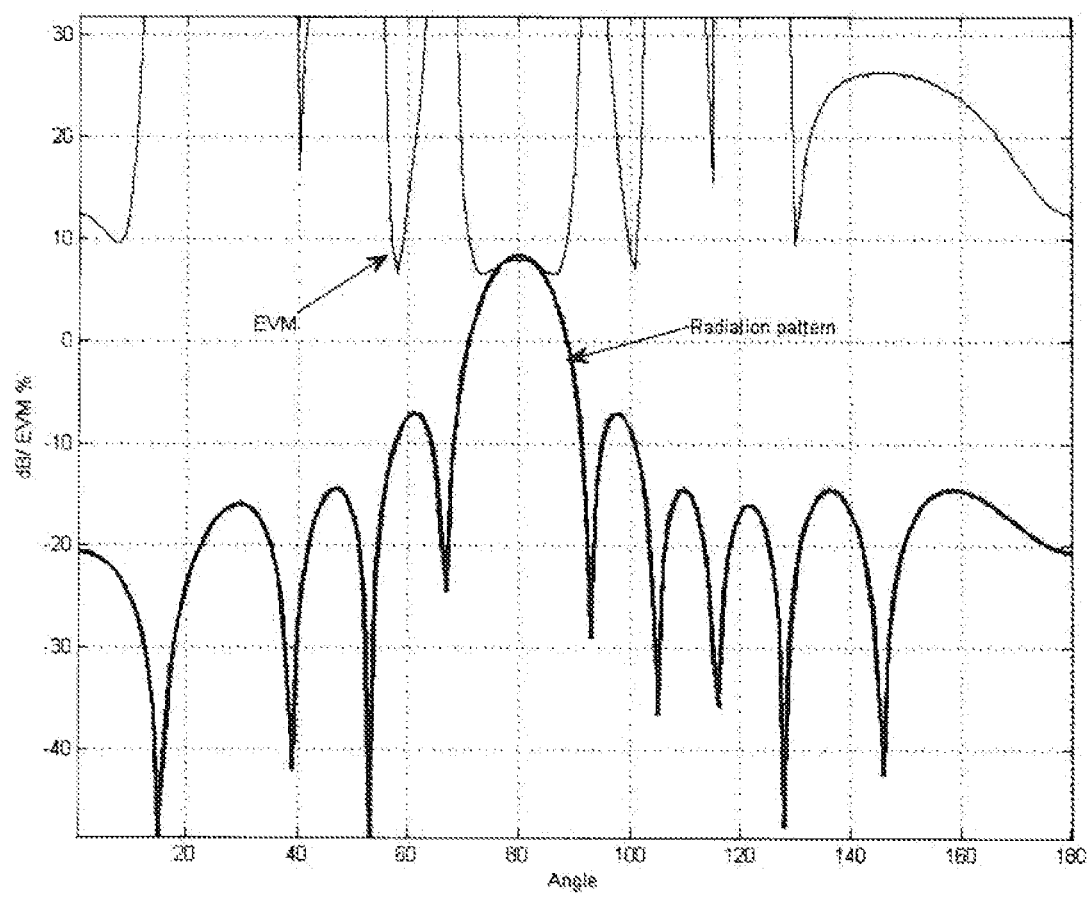
FIG. 8 illustrates EVM characteristic of an AAS created signal.

It is noted that the angular signal strength pattern as generally shown in FIG. 5 and in more detail in FIG. 8 may apply in a horizontal plane as well as in a vertical plane. In the first case, the reception quality may vary depending on the direction of a receiver, e.g. a user equipment, as seen from the base station 50. In the latter case, the reception quality may vary depending on the distance of a receiver, e.g. a user equipment, from the base station 50. Due to this effect, also denoted as vertical down tilt, even a receiver being close to a base station may experience poor reception quality resp. low signal strength.

By the above-described method and transmission system of the invention, this spatial characteristic can be corrected resp. mitigated.

Figure 6:
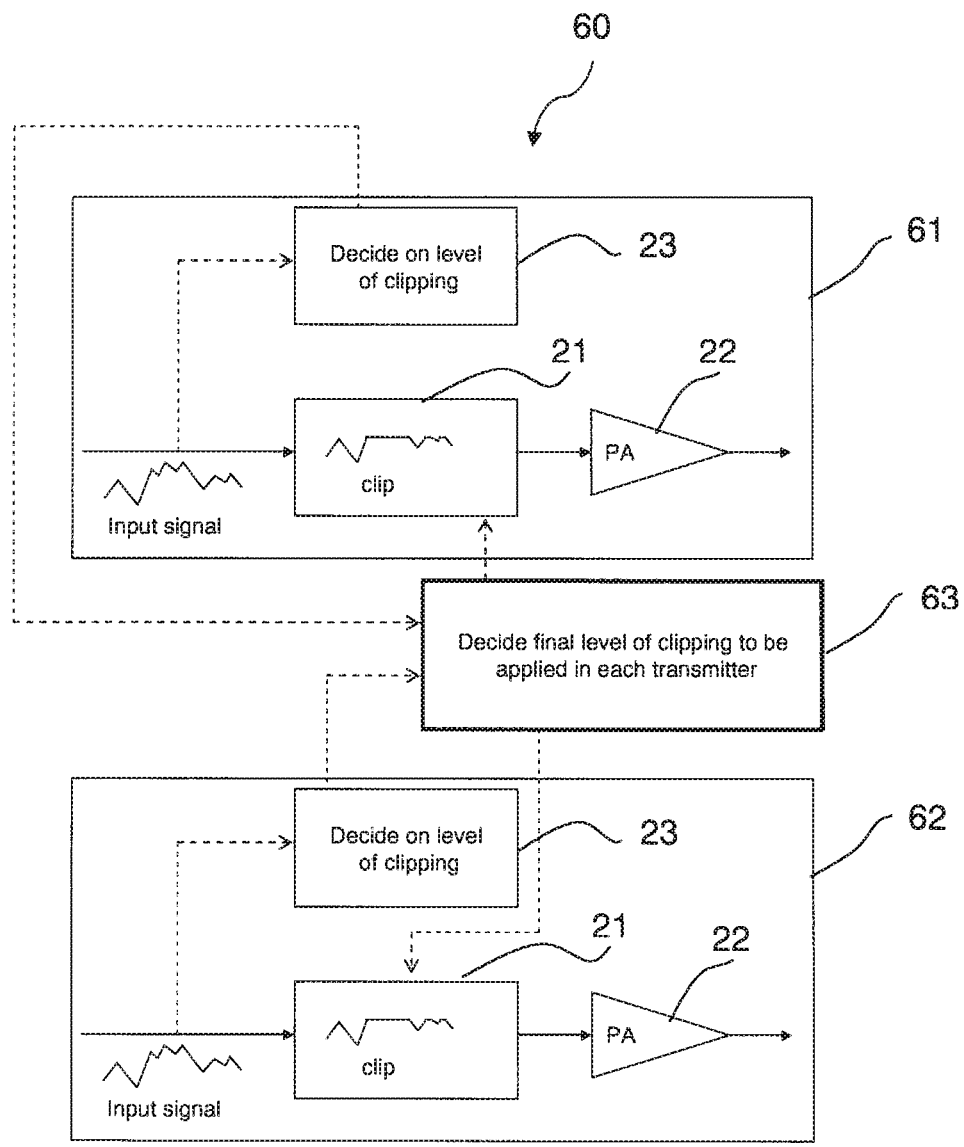
FIG. 6 shows a transmission system according to the invention.

An embodiment of the invention is depicted in FIG. 6. The figure illustrates an exemplary radio transmission apparatus 60, for example as part of a radio base station or the like, comprising two transmitters 61 and 62. Apparently, the shown example can be generalized to any number of transmitters. Transmitters 61 and 62 are in this example similar to transmitter 20 as described with respect to FIG. 2, so the above explanations also apply here, and corresponding elements are denoted with the same reference numerals as in FIG. 2.

Prior to each transmitter 61, 62, a gain and phase shift is applied to the input signal such that beamforming is achieved on the radiated signal.

Inside each transmitter 61, 62, an algorithm—for example implemented on a processor 23, be it in hardware, software or a combination thereof—analyses the input signal level and peak to average ratio and decides how much clipping it is necessary to perform. However an additional stage then compares the clipping level decided at each of the individual transmitters 61, 62, and reselects new individual clipping levels for each of the transmitters 61, 62 such that the clipping level is not necessarily reduced at all transmitters 61, 62, but is increased at some transmitters such that the ratio of clipping to wanted signal is the same at every transmitter. This additional stage may for example be implemented in form of a processing unit 63, which may be any type of processor as known to the skilled person which is executing an according program, and may be implemented in hardware, software or a combination thereof.

In this manner, the spatial pattern of the clipping noise can be adjusted such that it becomes the same as that of the wanted signal, and regions in space in which the ratio of received wanted signal to clipping noise is poor are avoided.

It is also conceivable that both clipping and weight tapering can be modified which will have the impact of modifying both the wanted signal and the clipping distortion spatial patterns.

Figure 7:
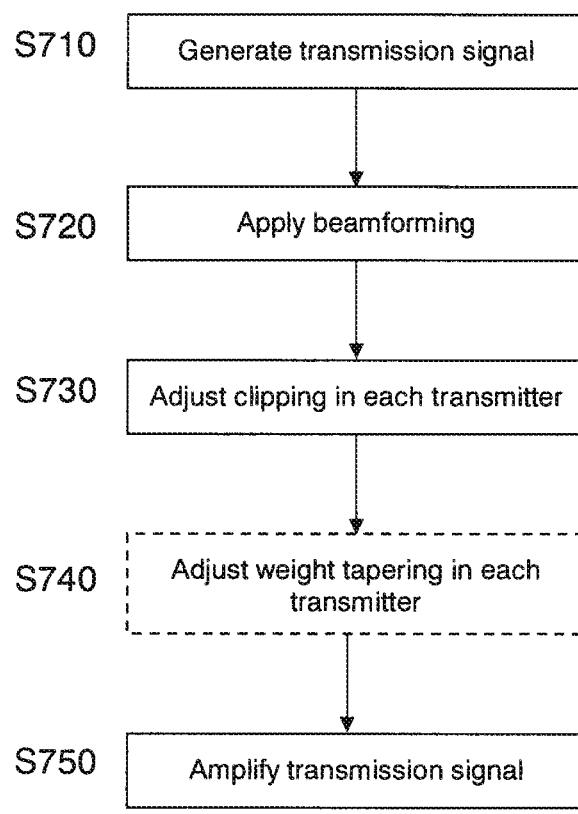
FIG. 7 shows a flow diagram according to an embodiment of the present disclosure.

FIG. 7 shows an exemplary method flow for processing signals in a radio transmission unit. After generating a signal to be transmitted by the radio transmission unit in step S710, beamforming is applied in step S720. This is accomplished by adjusting gain and/or phase for each of a plurality of transmitters of the transmission unit, said transmitters e.g. being part of transceivers as shown with respect to FIG. 1 or 6. Then, in step S730, the amount of clipping is adjusted in each of the plurality of transmitters. This may be accomplished by setting an individual clipping threshold or an individual amount of clipping in each transmitter. For example, clipping may be adjusted such that the ratio of the clipping signal to the wanted signal, as depicted in FIG. 3, is the same in each transmitter. Optionally, also individual weight tapering may be applied in each transmitter in step S740. It is also conceivable that weight tapering and clipping adjustment may be combined in a single step; particularly adjustment of clipping and weight tapering may be accomplished such that a desired spatial distribution of the transmission signal results based on the individual transmission signals of the transmitters. After these adjustments have been made, the signal in each transmitter are amplified in step S750 and output to antenna elements for radio transmission.

The principle advantage of the above methods and devices is that points in space at which distortion components of the transmitted signal are received with high gain whilst the wanted signal is experienced at low gain can be avoided. This in turn avoids the need to set very stringent requirements on EVM at each of the transmitters in order to provide sufficient EVM at the worst point in space, which will prevent a significant increase in the cost, size and power consumption of the radio transmitters. Further, it is possible by the above methods to direct the distortion beam in a different direction to the signal beam, such that the EVM in the main lobe of the signal beam can be increased even further, and particularly beyond what is possible with passive systems.

Figure 9:
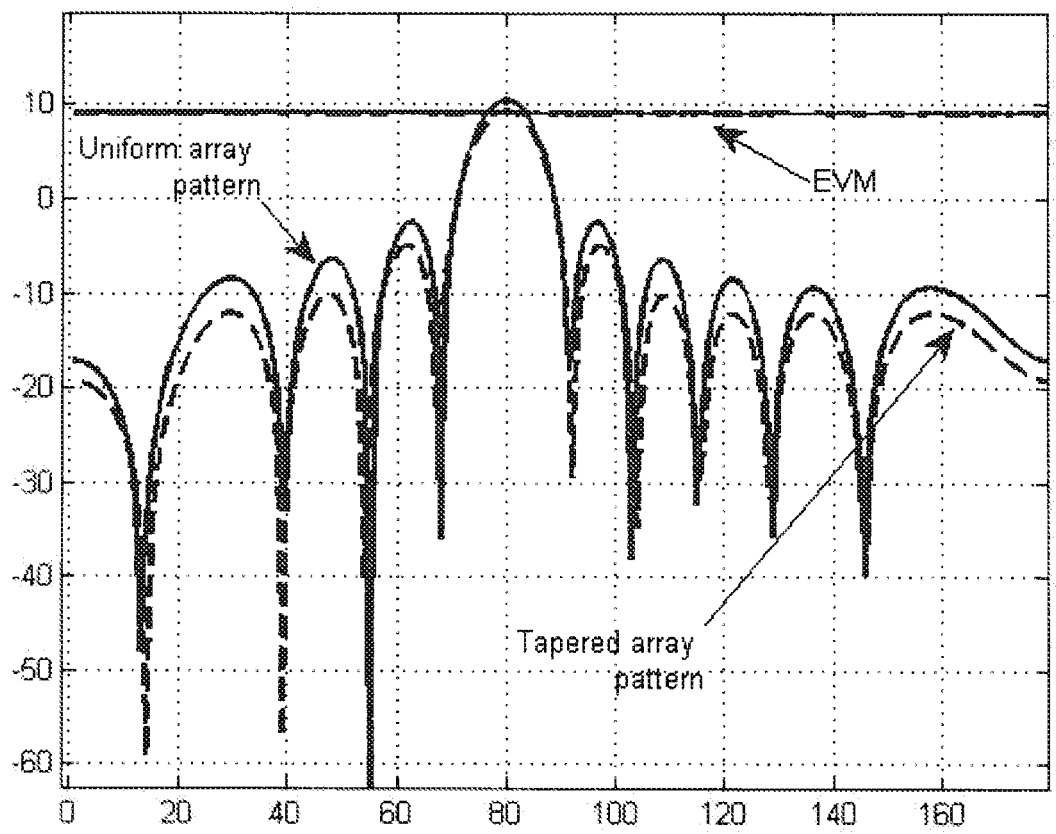
FIG. 9 illustrates EVM characteristic of an AAS created signal according to the invention.

This advantage is illustrated in FIGS. 8 and 9.

FIG. 8 shows the EVM characteristic of a signal created from an AAS array when tapering is applied to the weights. The lower curve shows the angular radiation pattern of a wanted signal, while the upper curve shows the angular distribution of the EVM. Due to the difference in the shape of the clipping noise (which is the dominant component of the EVM in this example) and the wanted beam, large fluctuations are observed in the EVM characteristic. Particularly at locations where nulls in the radiation pattern of the wanted signal occur, the EVM becomes very high. This is mainly due to the fact that the EVM contributions may under the circumstances taken into account here not be considered as correlated among array elements and as a result a deviation from the usual beam forming characteristics as in a coherent antenna array system occurs.

FIG. 9 illustrates the impact of modifying the clipping according to the invention for an AAS created signal where tapering is applied. The lower curves depict the angular radiation pattern of a wanted signal, wherein the continuous line depicts the pattern for a uniform array excitation and the dashed line depicts the pattern for a tapered array. The upper lines depict the resulting EVM distribution if clipping and/or tapering is adjusted as described above, wherein the continuous and the dashed line again correspond to the uniform and tapered pattern, respectively, and are lying on top of each other. As can be seen, in this case the clipping distortion, i.e. the EVM, relative to the wanted signal becomes uniform.

Alternatively, it is conceivable to adjust the level of clipping on some or all transmitters such that although the spatial pattern of the clipping signal is not the same as the wanted signal, the level of clipping noise is reduced at the location of the scheduled receiver, e.g. UE. In this case, points of poor SNR or EVM may still exist but are acceptable as not affecting the receiver.

Thus, the same advantages as mentioned above apply. In any case, another advantage of all embodiments would be that the key performance in terms of bit-rate can be maintained in systems with AAS.

Clearly, several modifications will be apparent to and can be readily made by the skilled in the art without departing from the scope of the present invention. Therefore, the scope of the claims shall not be limited by the illustrations or the preferred embodiments given in the description in the form of examples, but rather the claims shall encompass all of the features of patentable novelty that reside in the present invention, including all the features that would be treated as equivalents by the skilled in the art.

The invention claimed is:

1. A method for processing signals in a radio transmission apparatus comprising a plurality of radio transmitters, wherein clipping is applied to a signal in at least one of the plurality of radio transmitters, wherein the amount of clipping is adjusted individually for each of the plurality of radio transmitters, and
    wherein the amount of clipping is adjusted individually for each of the plurality of radio transmitters such that the ratio of a noise signal generated by clipping to a wanted signal is the same for all of the plurality of radio transmitters.

2. The method according to claim 1, wherein the amount of clipping is adjusted such that the ratio of a noise signal generated by clipping to a wanted signal at one or a plurality of predefined or dynamic locations of a receiver is minimized or/and kept below a predefined or dynamically adjusted threshold.

3. The method according to claim 1, wherein the amount of clipping is adjusted such that an error vector magnitude at one or a plurality of predefined or dynamic locations of a receiver is minimized or/and kept below a predefined or dynamically adjusted threshold.

4. The method according to claim 1, wherein the amount of clipping is adjusted such that a spatial distribution of a noise signal generated by clipping is substantially identical to a spatial distribution of a wanted signal.

5. The method according to any of claim 1, wherein the amount of clipping is adjusted such that the direction of a main lobe of a noise signal generated by clipping is different from the direction of a main lobe of a wanted signal.

6. The method according to claim 1, wherein clipping is applied prior to a amplifying the signals.

7. The method according to claim 1, wherein additional clipping is applied in a baseband circuit in order to adjust a spatial pattern of a noise signal generated by clipping.

8. The method according to claim 1, wherein weight tapering is adjusted in addition to clipping individually for each of the plurality of radio transmitters.

9. The method according to claim 1, wherein the radio transmission apparatus comprises an active antenna system.

10. The method according to claim 1, wherein beamforming is applied by according control of the plurality of radio transmitters.

11. A radio transmission apparatus comprising a plurality of radio transmitters which are adapted to apply clipping to an input signal to be transmitted, wherein the amount of clipping is adjusted individually for each of the plurality of radio transmitters such that the ratio of a noise signal generated by clipping to a wanted signal is the same for all of the plurality of radio transmitters.

12. The radio transmission apparatus of claim 11, comprising a plurality of power amplifiers connected to or being comprised in the radio transmitters and adapted to amplify an input signal before transmission.

13. The radio transmission apparatus of claim 11, comprising a plurality of antennas connected to the radio transmitters and/or the power amplifiers.

14. The radio transmission apparatus of claim 11, comprising an active antenna system.

15. The radio transmission apparatus of claim 11, comprising at least one processor being adapted to determine an amount of clipping to be applied at each radio transmitter.

16. The radio transmission apparatus of claim 11, wherein the radio transmission apparatus is a radio base station of a wireless communication network.

17. The radio transmission apparatus comprising a plurality of radio transmitters which are adapted to apply clipping to an input signal to be transmitted, wherein the amount of clipping or/and a clipping threshold is adjusted individually for each of the plurality of radio transmitters, being adapted to perform the method of claim 1.

18. A computer program product comprising a non-transitory computer readable medium storing instructions, which when executed or interpreted by at least one processor cause the at least one processor to carry out the method of claim 1, wherein the non-transitory computer readable medium is or comprises one of a magnetic tape or disk, optical disk, and semiconductor memory.

19. The method of claim 1, wherein the amount of clipping is adjusted individually for each of the plurality of radio transmitters by: i) setting a clipping threshold for each of the plurality of radio transmitters and/or ii) setting an individual amount of clipping in each of the plurality of radio transmitters.

* * * * *